(12) United States Patent
Mizuguchi

(10) Patent No.: US 7,500,827 B2
(45) Date of Patent: Mar. 10, 2009

(54) HOLDING DEVICE FOR HOLDING COOLING FAN

(75) Inventor: Keisuke Mizuguchi, Osaka (JP)

(73) Assignee: Kyocera Mita Corporation (JP)

( * ) Notice: Subject to any disclaimer, the term of this patent is extended or adjusted under 35 U.S.C. 154(b) by 352 days.

(21) Appl. No.: 11/406,559

(22) Filed: Apr. 19, 2006

(65) Prior Publication Data
US 2006/0237165 A1 Oct. 26, 2006

(30) Foreign Application Priority Data
Apr. 22, 2005 (JP) ............................. 2005-124970

(51) Int. Cl.
*F24F 7/00* (2006.01)
(52) U.S. Cl. .................. 415/213.1; 415/214.1; 415/178
(58) Field of Classification Search ................. 415/177, 415/178, 213.1, 214.1
See application file for complete search history.

(56) References Cited

U.S. PATENT DOCUMENTS 4,517,880 A * 5/1985 Buckner et al. ............. 454/184
5,713,790 A * 2/1998 Lin ............................ 454/184
6,215,659 B1 * 4/2001 Chen .......................... 361/695
6,587,335 B1 * 7/2003 Nelson et al. ............... 361/687
6,826,048 B1 * 11/2004 Dean et al. .................. 361/695

FOREIGN PATENT DOCUMENTS

JP     2000-172031     6/2000

* cited by examiner

*Primary Examiner*—Igor Kershteyn
(74) *Attorney, Agent, or Firm*—Gerald E. Hespos; Anthony J. Casella (57) ABSTRACT

A holding device for holding a cooling fan comprising: a duct having a hollow in which a cooling fan is to be fitted; a stopper portion which keeps one operative end of the cooling fan from further moving to hold the cooling fan at a fitting position; and a plurality of elastic wall segments formed in a cooling fan insertion end of a wall of the duct; wherein each of some of the plurality of elastic wall segments is formed with a locking claw for keeping the other operative end of the cooling fan from moving. With this construction, the cooling fan 31 can be more surely mounted in a duct. Consequently, vibration reduction effect and sound reduction effect with respect to the cooling fan is improved.

14 Claims, 7 Drawing Sheets

HOLDING DEVICE FOR HOLDING COOLING FAN

BACKGROUND OF THE INVENTION

1. Field of the Invention

The present invention relates to a holding device for holding a cooling fan.

2. Description of the Related Art

In a conventional holding device for holding a cooling fan, as described in Japanese Unexamined Patent Publication No. 2000-172031, a cooling fan is fitted into a cylindrical member which is molded of an elastic member, such as rubber, and is fixed by screws.

In the holding device for holding a cooling fan of the prior art, a cooling fan is held by an elastic cylindrical member to enhance the vibration reduction effect and sound reduction effect.

However, the holding device of Japanese Unexamined Patent Publication No. 2000-172031 requires use of an elastic cylindrical member, e.g., made of rubber, as a duct. Further, the cooling fan is required to be fixed to the elastic cylindrical member by screws. Consequently, there is the problem that the part cost and assembling cost rise.

SUMMARY OF THE INVENTION

The present invention has worked out in view of the problems described above, and an object of the invention is to provide a holding device for holding a cooling fan which requires less cost for parts and assembling and is high in the vibration and sound reduction effects.

According to an aspect of the present invention, a holding device for holding a cooling fan comprises: a duct having a hollow in which a cooling fan is to be fitted; a stopper portion which keeps one operative end of the cooling fan from further moving to hold the cooling fan at a fitting position; and a plurality of elastic wall segments formed in a cooling fan insertion end of a wall of the duct, wherein each of some of the plurality of elastic wall segments is formed with a locking claw for keeping the other operative end of the cooling fan from moving.

With this construction, when the cooling fan is fitted into the duct, one operative end of the cooling fan is kept from moving by the stopper portion and the other operative end of the cooling fan is kept from moving by the locking claw formed on an elastic segment. Consequently, the cooling fan is assuredly attached to the duct, which thereby increases the vibration reduction effect and the sound reduction effect with respect to the cooling fan.

These and other objects, features, aspects, and advantages of the present invention will become more apparent from the following detailed description of the preferred embodiments/examples with reference to the accompanying drawings.

DETAILED DESCRIPTION OF THE PREFERRED EMBODIMENT

Figure 1:
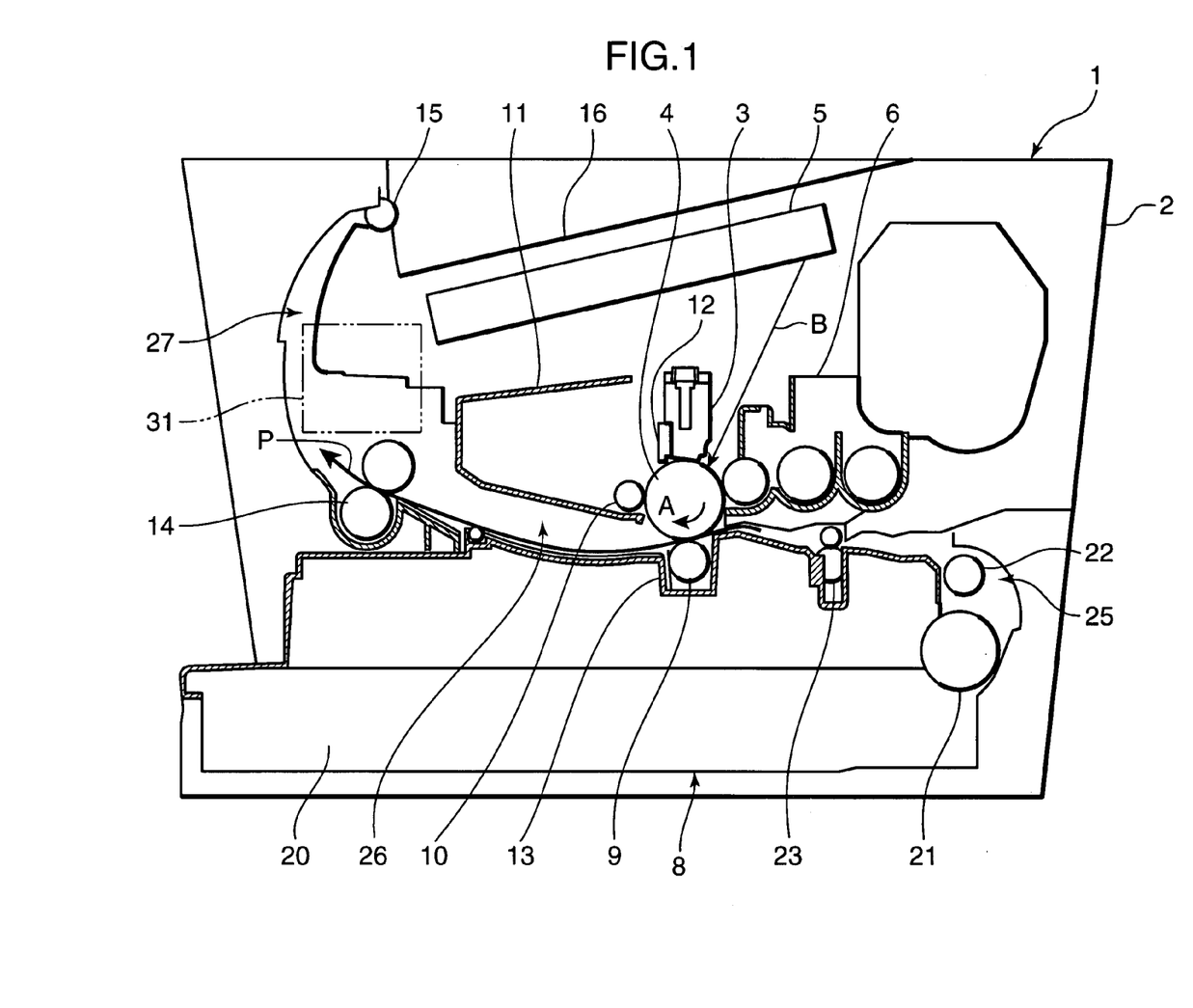
FIG. 1 is a cross-sectional side view showing an image forming apparatus according to an embodiment of the invention.

As shown in FIG. 1, in a box-shaped main body 2 of a printer 1, that is one of image forming apparatuses, a charging device 3 charges uniformly a peripheral surface of a photoconductive drum 4 which rotates in a direction A as shown in FIG. 1. An exposing portion 5 irradiates a laser light ray B based on an image data to the peripheral surface of the photoconductive drum 4 to form an electrostatic latent image. A developing device 6 supplies toner to the electrostatic latent image formed on the photoconductive drum 4. Consequently, a toner image is formed on the peripheral surface of the photoconductive drum 4.

A paper sheet P is conveyed from a paper feeding mechanism 8 to the photoconductive drum 4. A transferring roller (a transferring device) 9 transfers the toner image formed on the surface of the photoconductive drum 4 to a surface (transferred surface) of the paper sheet P. After the transfer of the toner image is completed, a cleaning device 11 including a cleaning roller 10 removes the toner left on the photoconductive drum 4. Then, a charge removing device 12 removes a residual electric charge left on the photoconductive drum 4.

Then, the paper sheet P which is separated from the photoconductive drum 4 by a separating device 13 is conveyed to a pair of fixing rollers (fixing device) 14. The toner image is fixed on the paper sheet P by the fixing roller pair 14, and then the paper sheet P is directly (or after being turned over by an unillustrated switch back device for a double-face printing) discharged to a discharging portion 16 by a discharging roller 15.

The paper feeding mechanism 8 includes a paper feeding cassette 20 which is detachably mounted on the printer main body 2, and stores a number of paper sheets P being stacked. This paper feeding cassette 20 includes a pickup roller 21 for picking up a stored paper sheet P. The paper feeding cassette 20 also includes a paper feeding roller 22 for feeding a paper sheet P picked up by the pickup roller 21 to a conveyance passage each picking. At the upstream (on the right hand side in FIG. 1) of the photoconductive drum 4 in the conveyance passage, a pair of registration rollers 23 for holding the paper sheet P transferred from the paper feeding roller 22 is mounted.

The conveyance passage further includes a first conveyance passage 25 for conveying the paper sheet P from the paper feeding cassette 20 to the photoconductive drum 4, a second conveyance passage 26 for conveying the paper sheet P from the photoconductive drum 4 to the fixing roller pair 14, and a third conveyance passage 27 for conveying the paper sheet P from the fixing roller pair 14 to the discharging roller 15.

Figure 2:
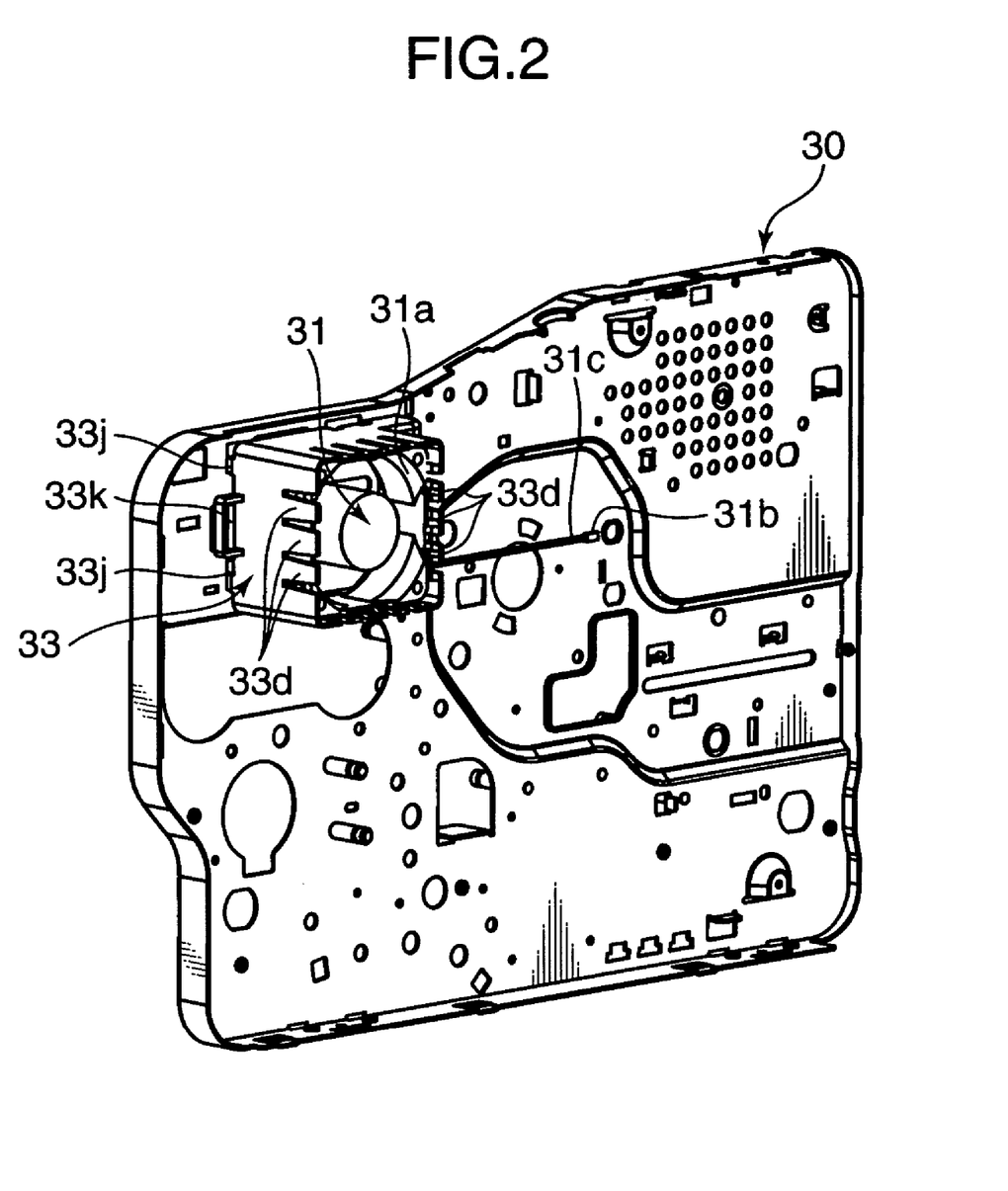
FIG. 2 is a perspective view showing a metal frame on which a holding device holding a cooling fan is mounted.

A cooling fan 31 is mounted on a metal frame 30 (shown in FIG. 2) of the printer main body 2. As indicated by the double-dotted chain line in FIG. 1, the cooling fan 31 is mounted at a portion of the metal frame 30 in the half side where the fixing roller pair (fixing device) 14 is provided. Further, though it is not specifically illustrated, the metal frame 30 has an opening for taking in an outer air. The cooling fan 31 takes outer air into the printer main body 2 through the opening.

The fixing roller pair (fixing device) 14 has a heat generative body. Near the fixing roller pair (fixing device) 14, a polygon motor, which has also a heat generative body, is provided. The cooling fan 31 generates an air flow which is taken in to cool the heat generative bodies.

Figure 3A:
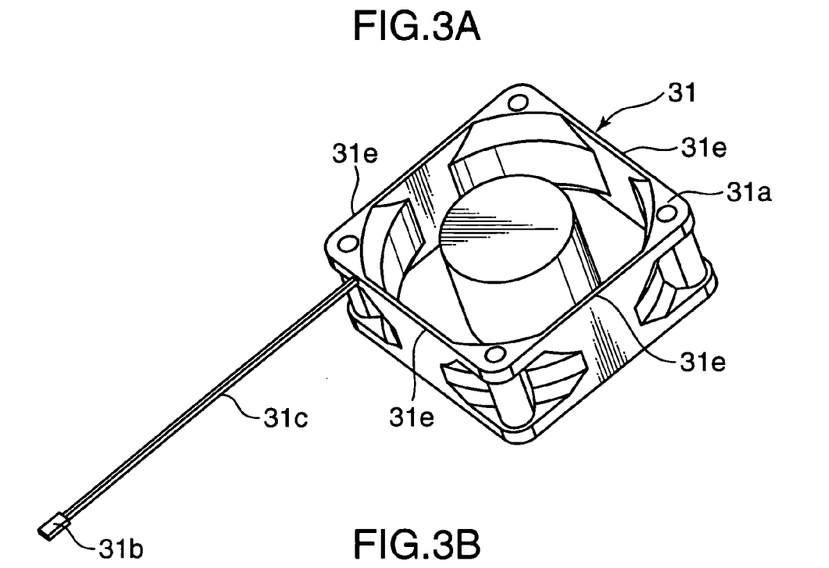
FIG. 3A is a perspective view showing the cooling fan.

The cooling fan 31 includes a rectangular-shaped fan main body 31a. As shown in FIG. 3A, in a center portion of the fan main body 31a, a fan which is to be driven by an electric motor is provided. Electricity is supplied to the electric motor by a connector 31b through a lead wire 31c.

Figure 3B:
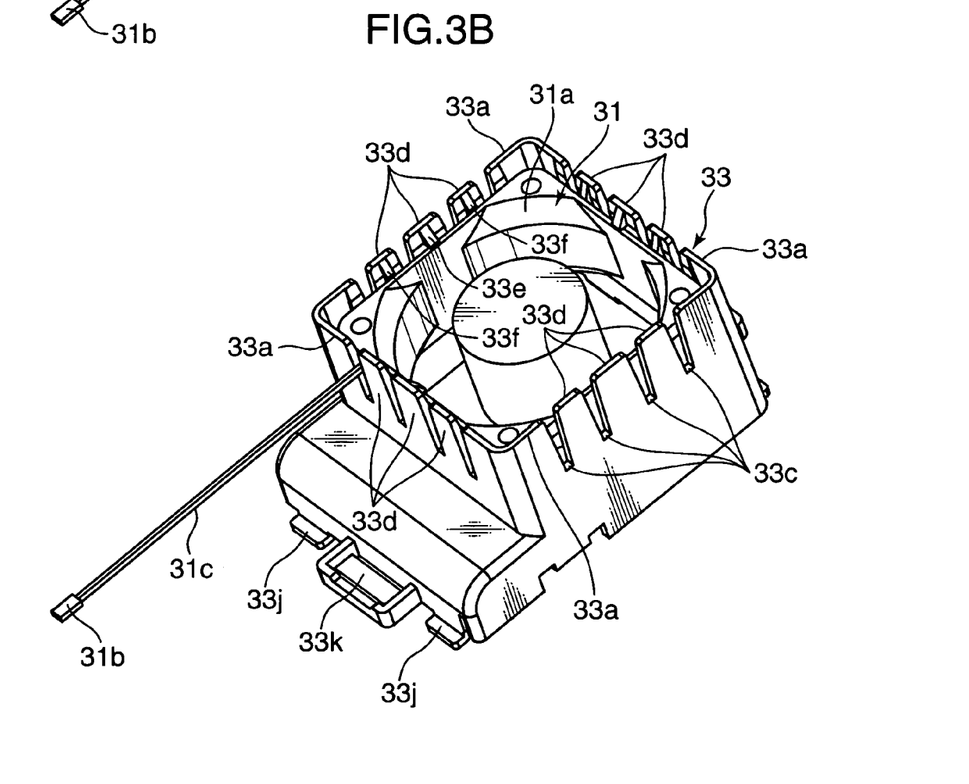
FIG. 3B is a perspective view showing the holding device in which the cooling fan is to be fitted.

As shown in FIG. 3B, the cooling fan 31 is fitted into a holding device 33 made of a plastic resin and held on the holding device 33.

Figure 4A:
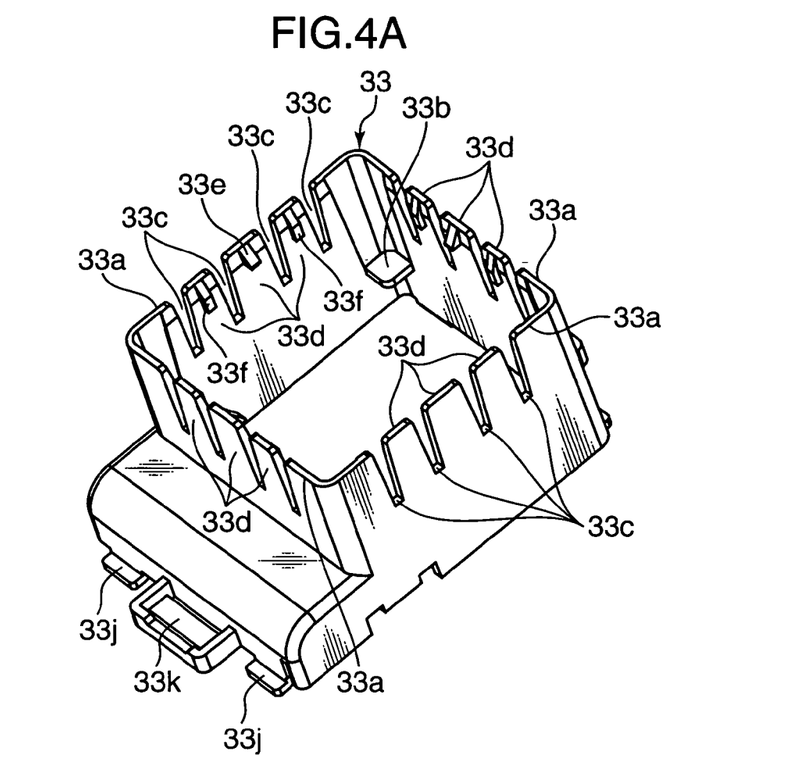
FIG. 4A is a perspective view showing the holding device.
Figure 4B:
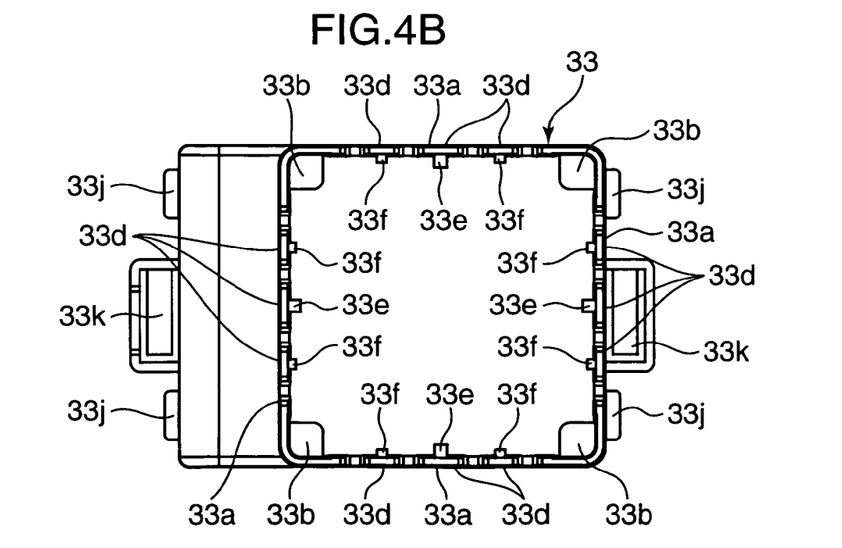
FIG. 4B is a plan view showing the holding device.

As shown in FIGS. 4A and 4B, the holding device 33 has a cross section of a rectangle. At each of four corners of four side wall portions (duct) 33a, a stopper portion 33b which keeps each corner of a lower end (one operative end) of the fan main body 31a of the cooling fan 31 from further moving to hold the cooling fan 31 at an attachment position.

Each of the four side wall portions 33a of the holding device 33 has a plurality of slits 33c (four slits in this embodiment) formed in a cooling fan insertion end. The slits 33c define a plurality of elastic wall segments 33d (three segments in this embodiment). The slits enable each of the elastic wall segments 33d to be elastically bent inward and outward with respect to a hollow of the holding device 33.

Figure 5A:
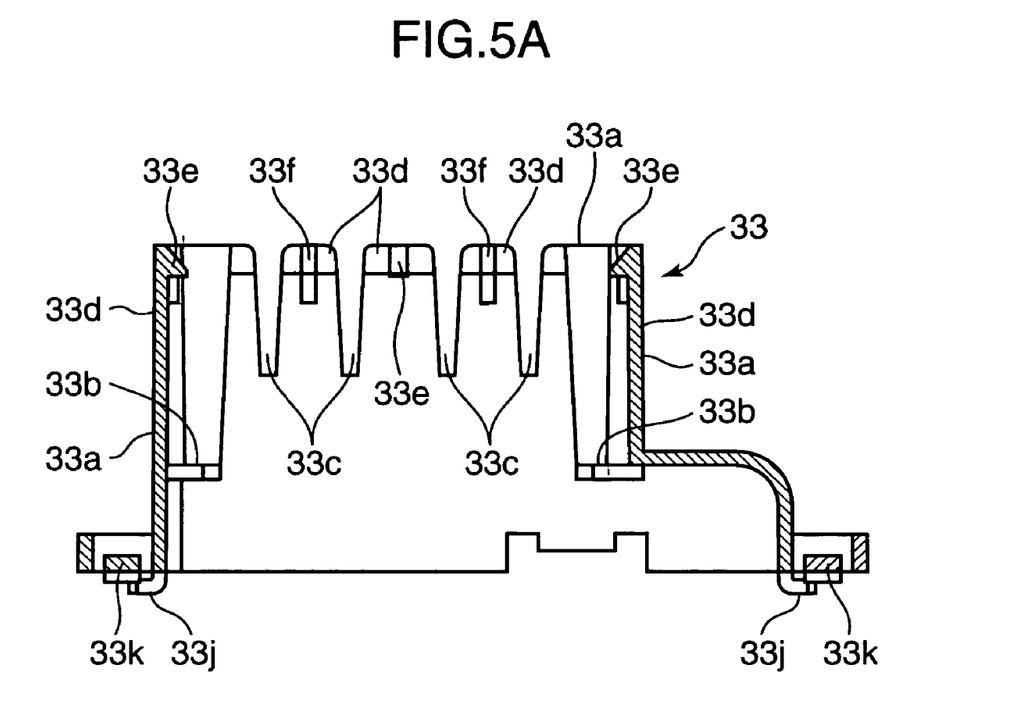
FIG. 5A is a cross-sectional view showing the holding device.

As shown in FIG. 5A, among the elastic wall segments 33d formed in each of the four side wall portions 33a, each of the elastic wall segments 33d located at center of each side is formed with a locking claw 33e for keeping the upper end (other operative end) of the cooling fan main body 31a from moving while the stopper portions 33b of the holding device 33 keep the lower end (one operative end) of the fan main body 31 from moving.

Further, among the plurality of elastic wall segments 33d formed in each of the four side wall portions 33a, each of the elastic wall segments 33d located adjacent to the elastic wall segment 33d (other elastic wall segments) is formed with a projection 33f which presses a side surface (a side surface between the operative ends) of the cooling fan main body 31a of the cooling fan 31 inward.

Figure 5B:
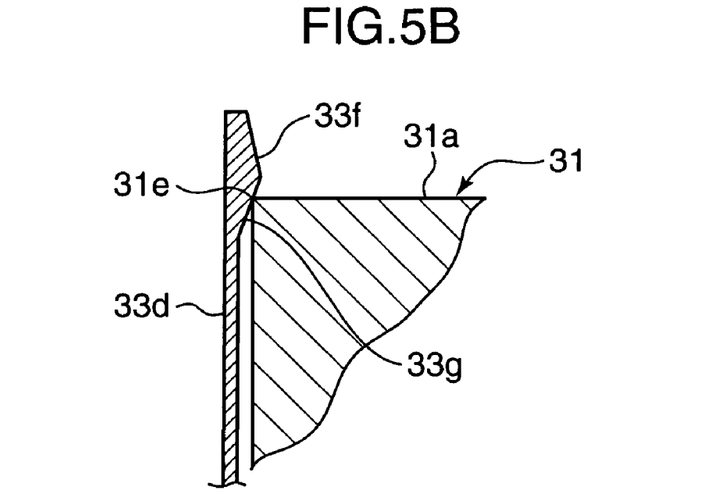
FIG. 5B is a cross-sectional view showing relevant parts of the holding device and the cooling fan.

As specifically shown in FIG. 5B, each of the projection 33f includes a slanting surface 33g which comes into contact with an upper side edge portion 313 of the fan main body 31a of the cooling fan 31 for pressing the cooling fan 31 toward the stopper portion 33b and/or inward.

At each of the four ends of the bottoms of the opposite left and right wall portions of the holding device 33, an L-shaped inserting claw (an attachment flange) 33j is formed. The L-shaped inserting claw 33j extends from the bottom of the holding device 33 in an axial direction, and then extends in a laterally outward direction at the distance from the bottom that corresponds to a thickness of the metal frame 30. Further, between the two inserting claws 33j on each of the left and right sides is formed a flange extending laterally outward from the side surface of the holding device 33, the flange being formed with a boss 33k on the bottom surface thereof.

Figure 6A:
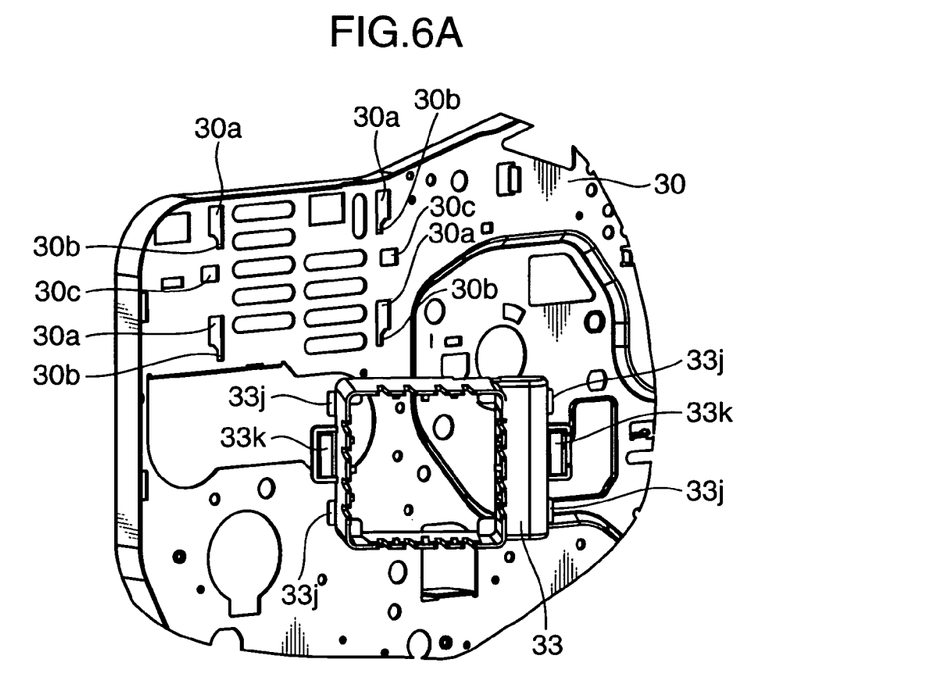
FIGS. 6A and 6B are perspective views showing steps of mounting the holding device to the metal frame.

As shown in FIG. 6A, openings each having a window 30a and a slit portion 30b are formed in the metal frame 30. The openings respectively correspond to the inserting claws 33j of the holding device 33. The windows 30a allow the inserting claws 33j to pass laterally. The slit portion 30b extends downward from the window 30a.

Further, the metal frame 30 is formed with fixing holes 30c for retaining the bosses 33k respectively correspondingly to the bosses 33k.

Figure 6B:
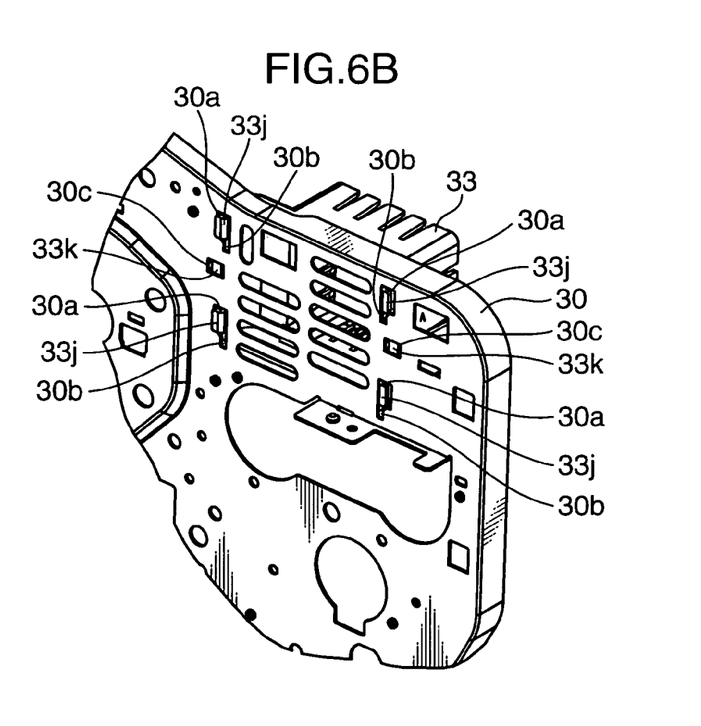

If each of the inserting claws 33j of the holding device 33 is passed through the window portion 30a of the metal frame 30 laterally, and is slid downward along the slit portions 30b as shown in FIG. 6B, each of the inserting claws 33j comes in contact with the lower edges of the slit portion 30b. Consequently, the holding device 33 is fixedly held to thereby keep the holding device 33 from moving in the forward and backward directions, the left and right directions, and the downward direction.

At the same time, the bosses 33k are placed in the fixing holes 30c to thereby keep the holding device 33 from moving in the upward direction.

In this way, the holding device 33 can be easily attached to the metal frame 30 with one-touch operation.

As described above, with the holding device for holding the cooling fan of the image forming apparatus, when the cooling fan 31 is fitted into the holding device 33, the lower end of the fan main body 31a of the cooling fan 31 comes in contact with the stopper portions 33b, and is thereby kept from further moving downward. The upper end of the main body 31a of the cooling fan 31 is locked by the locking claws 33e on each of the central elastic segments 33d. At the same time, the side wall portions of the main body 31a of the cooling fan 31 is pressed inward from four directions by the projections 33f of the elastic segments 33d on the opposite sides.

Accordingly, since the cooling fan 31 is assuredly mounted in the holding device 33, the vibration reduction effect and the sound reduction effect with respect to the cooling fan 31 can be increased.

Further, the holding device does not require use of an elastic cylindrical body, e.g., made of rubber, as the holding device 33, and the holding device 33 can be made of an inexpensive plastic resin material. Furthermore, the cooling fan 31 can be easily mounted in the holding device 33 with one-touch operation in the attachment operation. Consequently, the costs for parts and assembling can be considerably reduced.

Furthermore, since the slanting surface 33g which presses the upper side edge portion 313 of the main body 31a of the cooling fan 31 inward or toward the stopper portion 33b is formed on each of the projections 33f of the elastic segments 33d, the upper side edge portion 313 of the cooling fan 31 is pressed toward the stopper portion 33b. Consequently, the cooling fan 31 can be more assuredly mounted in the holding device 33.

Furthermore, as shown in FIG. 3B, a lead wire 31c of an electric motor of the cooling fan 31 can be efficiently arranged utilizing one of the slits 33c formed in the holding device 33.

Figure 7:
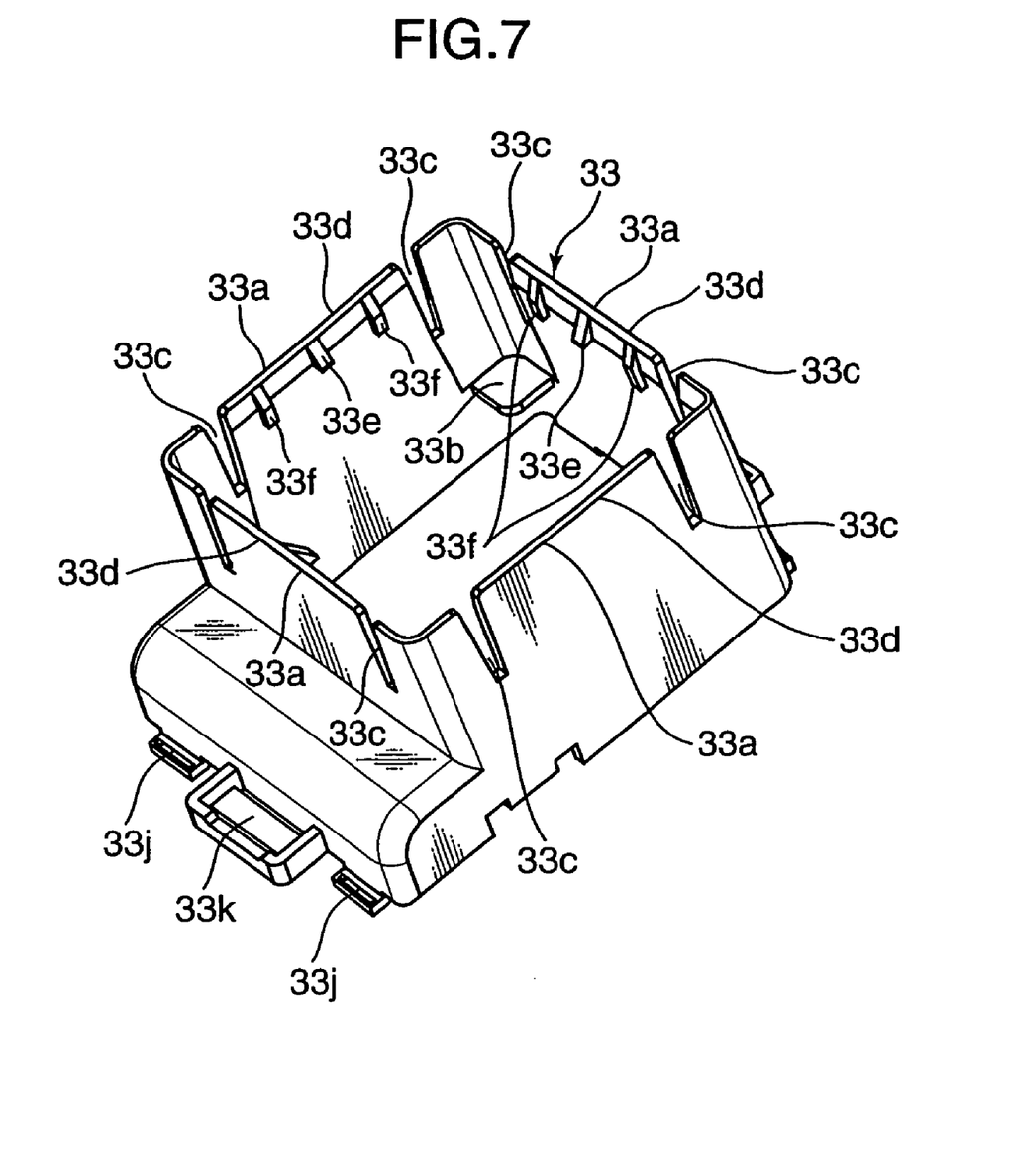
FIG. 7 is a perspective view showing a modified holding device.

According to the embodiment, a plurality of (three in the embodiment) the elastic segment 33d is formed on each of the four side wall portions 33a of the holding device 33. However, as shown in FIG. 7, a single elastic segment 33d formed with a locking claw 33e and projections 33f may be formed in each of the four side wall portions 33a.

According to the embodiment, the cooling fan 31 is fitted and fixed in the holding device 33 having the cross-section of a rectangle. However, it may be appreciated to use a holding device 33 having the cross-section of a polygon other than a rectangle, or the cross-section of a circle. The cross-section of an outer casing of the cooling fan 31 may be formed so as to be in conformity with the inner shape of the holding device 33.

The foregoing embodiment refers to the holding device for holding a cooling fan 31 that is attached in an image forming apparatus. However, it goes without saying that the present invention can be applied to an apparatus other than an image forming apparatus.

As described above, a holding device for holding a cooling fan comprises: a duct having a hollow in which a cooling fan is to be fitted; a stopper portion which keeps one operative end of the cooling fan from further moving to hold the cooling fan at a fitting position; and a plurality of elastic wall segments formed in a cooling fan insertion end of a wall of the duct. Each of some of the plurality of elastic wall segments is formed with a locking claw for keeping the other operative end of the cooling fan from moving.

With this construction, when the cooling fan is fitted in the duct, the one operative end of the cooling fan is kept from further moving by the stopper portion, and the other operative end of the cooling fan is locked by the locking claw formed on each of some of the elastic segments. Accordingly, the cooling fan can be assuredly mounted on the duct. Consequently, the vibration reduction and the sound reduction effect with respect to the cooling fan can be enhanced. Further, the holding device does not require the use of a cylindrical elastic body, e.g., made of rubber, as the holding device. The holding device can be made of an inexpensive plastic resin material. In accordance with the fitting operation, the cooling fan 31 can be locked onto the holding device with one-touch operation. Consequently, the costs for parts and assembling can be reduced.

Further, it may be preferable that each of the other elastic wall segments is formed with a projection which presses the cooling fan inward. With this construction, the cooling fan is pressed inward. Accordingly, the cooling fan can be more surely mounted in the duct.

It may be preferable that the duct has a cross section of a rectangle, and four wall segments formed with the projection are arranged on the four sides of the duct, respectively. With this construction, the cooling fan is pressed from four opposite sides. Consequently, the cooling fan can be more surely held in the duct.

It may be preferable that the projection includes a slanting surface to come into contact with a side edge of the cooling fan for pressing the cooling fan toward the stopper portion. With this construction, the projection and the stopper portion cooperates to hold the cooling fan. Consequently, the vibration reduction and the sound reduction effect can be increased.

It may be preferable that each of the predetermined elastic segments is formed with a projection for pressing which presses the cooling fan inward. With this construction, the cooling fan is pressed inward. Consequently, the cooling fan can be more surely mounted in the duct.

It may be preferable that the elastic segment is defined by slits formed in the cooling fan insertion end of the wall of the duct. With this construction, the elastic segments can be easily formed by forming slits.

It may be preferable that a lead wire of an electric motor of the cooling fan is passed through the slit. With this construction, a lead wire of the electric motor can be efficiently placed.

In the case where the holding device is mounted on an image forming apparatus provided with a frame member formed with attachment holes and fixing holes, it may be preferable to form an attachment flange on each of respective attachment edges of the opposite side walls of the duct for retaining the duct to the frame member in a state of being passed through the attachment holes and a boss on each of the respective attachment end edges of the opposite walls of the duct for keeping the duct from moving in a state of being placed in the fixing hole. With this construction, a holding device in which a cooling fan is mounted can be more surely mounted on the frame member of the image forming apparatus.

This application is based on patent application No. 2005-124970 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A holding device for holding a cooling fan comprising:
   a duct having a hollow in which a cooling fan is to be fitted;
   a stopper portion which keeps one operative end of the cooling fan from further moving to hold the cooling fan at a fitting position;
   a plurality of first elastic wall segments formed in a cooling fan insertion end of a wall of the duct, each of the first elastic wall segments is formed with a locking claw for keeping the other operative end of the cooling fan from moving; and
   a plurality of second elastic wall segments formed in the cooling fan insertion end of the wall of the duct, each of the second elastic wall segments being formed with a projection that presses the cooling fan inward.

2. A holding device for holding a cooling fan according to claim 1, wherein the duct has a cross section of a rectangle, and the second elastic wall segments are arranged on the four sides of the duct, respectively.

3. A holding device for holding a cooling fan according to claim 1, wherein each of the projections includes a slanting surface to come into contact with a side edge of the cooling fan for pressing the cooling fan toward the stopper portion.

4. A holding device for holding a cooling fan according to claim 1, wherein the projection on each of the second elastic wall segments presses a side between the opposite operative ends of the cooling fan inward.

5. A holding device for holding a cooling fan according to claim 4, wherein the projection includes a slanting surface to come into contact with a side edge of the cooling fan for pressing the cooling fan toward the stopper portion.

6. A holding device for holding a cooling fan according to claim 1, wherein the first and second elastic wall segments are defined by slits formed in the cooling fan insertion end of the wall of the duct.

7. A holding device for holding a cooling fan according to claim 1, wherein the device is to be attached in an image forming apparatus.

8. A holding device for holding a cooling fan according to claim 7, wherein the device is to be attached on a frame member provided in the image forming apparatus, and the frame member is formed with attachment holes and fixing holes, further comprising:
   an attachment flange formed on each of respective attachment end edges of the opposite walls of the duct for retaining the duct to the frame member in a state of being passed through the attachment holes; and
   a boss formed on each of the respective attachment end edges of the opposite walls of the duct for keeping the duct from moving in a state of being placed in the fixing hole.

9. A holding device for holding a cooling fan comprising:
   a duct having a hollow in which a cooling fan is to be fitted;

a stopper portion which keeps one operative end of the cooling fan from further moving to hold the cooling fan at a fitting position;

a plurality of slits formed in a cooling fan insertion end of the duct, the plurality of slits, defining at least a first plurality of elastic wall segments at the cooling fan insertion end of the wall of the duct, each of the elastic wall segments of the first plurality being formed with a locking claw for keeping the other operative end of the cooling fan from moving, wherein a lead wire of an electric motor of the cooling fan is passed through one of the slits.

10. A holding device for holding a cooling fan according to claim 9, wherein the slits further define a second plurality of elastic wall segment, each of second elastic wall segments is formed with a projection which presses the cooling fan inward.

11. A holding device for holding a cooling fan, the holding device comprising:

a duct having opposite first and second ends and a hollow extending between the ends, the hollow being configured for receiving the cooling fan;

at least one stopper projecting into the hollow at a position between the first and second ends of the duct, the stopper being dimensioned to stop the cooling fan at a fitting position in the hollow;

a plurality of first elastic wall segments adjacent the first end of the duct, each of the first elastic wall segments being formed with a locking claw between the first end of the duct and the stopper, the locking claws being dimensioned and disposed for locking the cooling fan between the locking claws and the stopper; and a plurality of second elastic wall segments adjacent the first end of the duct, each of the second elastic wall segments being formed with a sloped projection for urging the cooling fan both inwardly and towards the stopper.

12. A holding device for holding a cooling fan comprising:

a duct having a hollow in which a cooling fan is to be fitted;

a stopper portion which keeps a first operative end of the cooling fan from further moving into the hollow to hold the cooling fan at a fitting position; and a plurality of elastic wall segments formed respectively in cooling fan insertion ends of side wall portions of the duct, each of the plurality of elastic wall segments being formed with a locking claw for keeping a second operative end of the cooling fan from moving and a projection that presses the cooling fan inward.

13. A holding device for holding a cooling fan according to claim 12, wherein the projection includes a slanting surface to come into contact with a side edge of the cooling fan for pressing the cooling fan towards the stopper portion.

14. A holding device for holding a cooling fan comprising:

a duct having a hollow in which a cooling fan is to be fitted;

a stopper portion which keeps one operative end of the cooling fan from further moving to hold the cooling fan at a fitting position;

a plurality of elastic wall segments formed in a cooling fan insertion end of a wall of the duct, the elastic wall segments being defined by slits formed in the cooling fan insertion end of the wall of the duct; and wherein a lead wire of an electric motor of the cooling fan is passed through at least one of the slits.

* * * * *